United States Patent
Wun-Fogle et al.

[19]

[11] Patent Number: 6,139,648
[45] Date of Patent: Oct. 31, 2000

[54] PRESTRESS IMPOSING TREATMENT OF MAGNETOSTRICTIVE MATERIAL

[75] Inventors: Marilyn Wun-Fogle, Gaithersburg; James B. Restorff, College Park; Arthur E. Clark, Adelphi, all of Md.

[73] Assignee: The United States of America as represented by the Secretary of the Navy, Washington, D.C.

[21] Appl. No.: 09/252,782

[22] Filed: Feb. 19, 1999

[51] Int. Cl.$^7$ ....................................................... H01F 1/00
[52] U.S. Cl. ........................................... 148/121; 148/101
[58] Field of Search ..................... 148/101, 102, 148/121, 122

[56] References Cited

U.S. PATENT DOCUMENTS 4,308,474 12/1981 Savage et al. .
4,378,258 3/1983 Clark et al. .
5,453,291 9/1995 Sasahara et al. ............................ 427/8

FOREIGN PATENT DOCUMENTS 4-337055 11/1992 Japan .

OTHER PUBLICATIONS

Journal of Applied Physics—Jun. 1, 1998, pp. 7279–7281.
6th Int'l Conference on New Actuators—Jun. 17, 1998, pp. 1–4.

Primary Examiner—John Sheehan
Attorney, Agent, or Firm—John Forrest; Jacob Shuster

[57] ABSTRACT

Magnetostrictive material such as Terfenol-D undergoes annealing treatment by heating for a limited period of time to an elevated temperature below the melting point, followed by cooling to a preferred magnetic state in which a compressive stress generated and applied during treatment is retained in the treated material as a built-in prestress.

6 Claims, 2 Drawing Sheets

PRESTRESS IMPOSING TREATMENT OF MAGNETOSTRICTIVE MATERIAL

The present invention relates to annealing of materials under mechanical prestress in order to maximize magnetostriction during use in transducers or the like.

BACKGROUND OF THE INVENTION

Ferromagnetic alloy materials, such as Terfernol-D, have been utilized in magnetostrictive applications requiring high strains of 1500 ppm for example. A main drawback associated with some applications of magnetostrictive materials resides in exertion of mechanical stresses exceeding approximately 10 MPa for example, to achieve high strains.

It is presently known from previous studies that magnetic annealing treatment of magnetostrictive alloy material, helps remove certain imperfections therein and achieve a more preferential distribution of magnetic moments for delivery of larger magnetostrictive strain. It is also known that compressive prestress of the magnetostrictive material caused by applying a force thereto before a magnetic field is applied will align magnetic moments to affect magnetostriction by positioning the magnetic moments so as to lie perpendicular to the direction of the stress and the applied magnetic field parallel thereto. It is therefore an important object of the present invention to provide magnetostrictive material with improved electrical energy transformation efficiency in a wide variety of applications such as transducers, diver communication systems, ultrasonic devices, vibration control and hearing aids, by providing a maximizing degree of annealing under compressive prestress.

SUMMARY OF THE INVENTION

In accordance with the present invention, a magnetostrictive alloy material undergoes annealing treatment while subject to compressive stress. The annealing treatment according to one embodiment involves heating material such as Terfenol-D in a vacuum furnace to an elevated temperature below the material melting point for a period of limited duration during which an uniaxial compressive stress of 88 MPa is generated and applied to the material at its elevated temperature of 840° C. for example. Such heat treatment of the material under stress causes it to undergo microstructure readjustment in response to alloy flow. After cooling, the magnetostrictive material is then in a preferred magnetic state with a built-in prestress resulting from memory retention of the compressive stress exerted during annealment so as to provide maximized improvement in magnetostriction under the magnetic field applied during use.

BRIEF DESCRIPTION OF DRAWING

A more complete appreciation of the invention and many of its attendant advantages will be readily appreciated as the same becomes better understood by reference to the following detailed description when considered in connection with the accompanying drawing wherein.

DETAILED DESCRIPTION OF PREFERRED EMBODIMENTS

Figure 1:
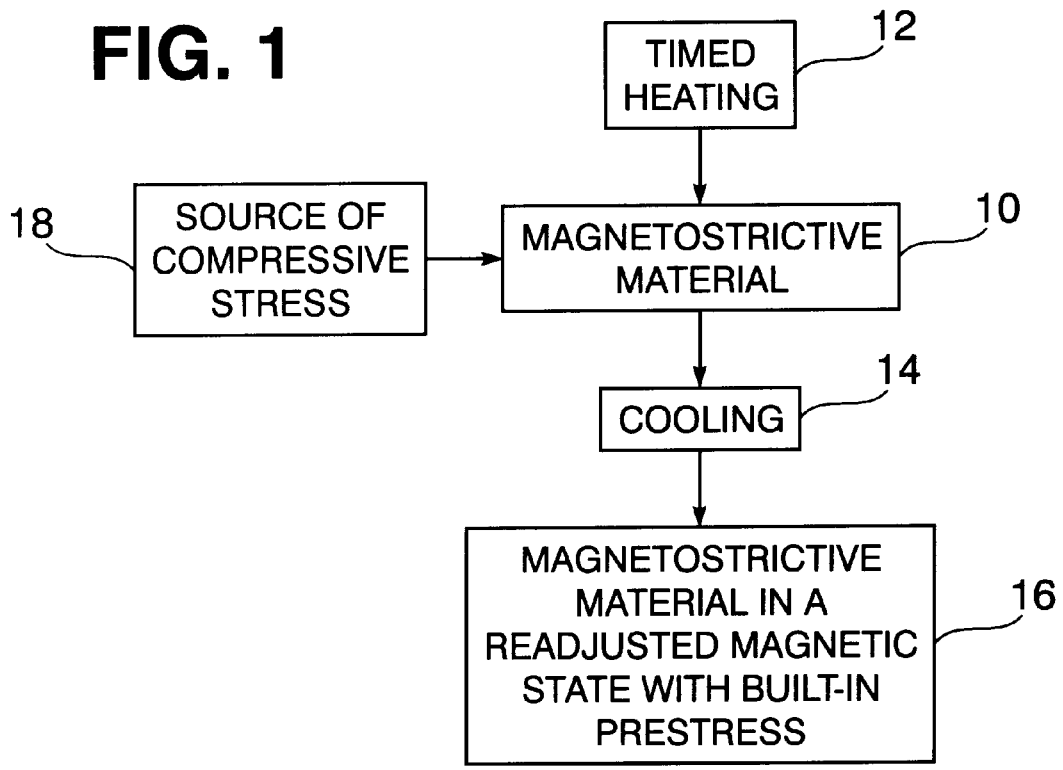
FIG. 1 is a block diagram schematically illustrating the material heat treatment process of the present invention.

Referring now to the drawing in detail, FIG. 1 diagrams an annealing treatment method of the present invention, wherein an untreated magnetostrictive material 10 is subject to timed heating 12 under conditions avoiding material damage, followed by a cooling stage 14 in order to produce a treated material 16 in a readjusted magnetic state with a built-in prestress for use in some magnetic strain imposing application with improved electrical energy conversion efficiency. FIG. 1 also diagrams a source of compressive stress 18 from which the built-in prestress is derived for the treated material 16.

According to one embodiment of the present invention, the magnetostrictive material 10 is a polycrystalline ferromagnetic alloy such as Terfenol-D, having a formula: $Tb_{0.27}Dy_{0.73}Fe_{1.95}$. Such ferromagnetic material was subject to compressive stress of at least 71 MPa up to 88 MPa or higher from source 18 which was externally generated and applied uniaxially while the material underwent timed heating 12 within a vacuum furnace chamber for ten (10) minutes to an elevated temperature of 840° C., slightly below the eutectic melting point for such material. Such compressive stress was maintained during the following cooling stage 14. As a result of such annealing treatment by sequential heating 12 and cooling 14 under compressive stress, the magnetostrictive material 1 was microstructurally readjusted by stress anisotropy, in response to alloy flow induced by its heating, so as to achieve the an improved magnetic state for the material with built-in prestress as denoted in FIG. 1, so as to achieve a maximized increase in magnetostriction of 42.8%. Additionally, a change in stress anisotropy to a more favorable state occurred as a result of atomic structure rearrangement of the magnetostrictive material rather than composition change.

By virtue of the foregoing described process of annealing under compressive stress, magnetostrictive materials which exhibited poor and/or unusable magnetostriction with no external applied prestress had their magnetostriction greatly increased to drive a variety of low power magnetostrictive devices without application of additional prestress. Furthermore, the use of magnetostrictive materials treated as hereinbefore described will significantly reduce bulkiness of small devices such as magnetostrictive hearing aids, while simplifying the design of larger devices such as active vibration control systems and sonar transducers.

Figure 2:
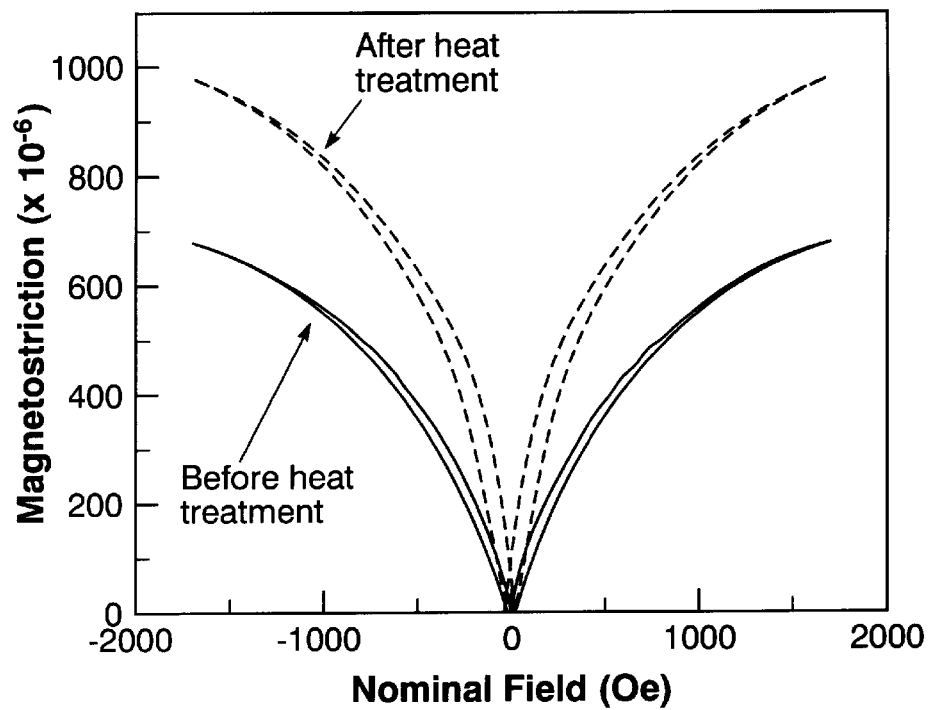
FIG. 2 is a graphical illustration of comparative variations in magnetostriction of an unloaded sample of Terfenol-D heat treated at 840° C. for 10 minutes under a compressive prestress of 88 MPa as a function of the magnetic field applied thereto before and after heat treatment in accordance with the present invention.
Figure 3:
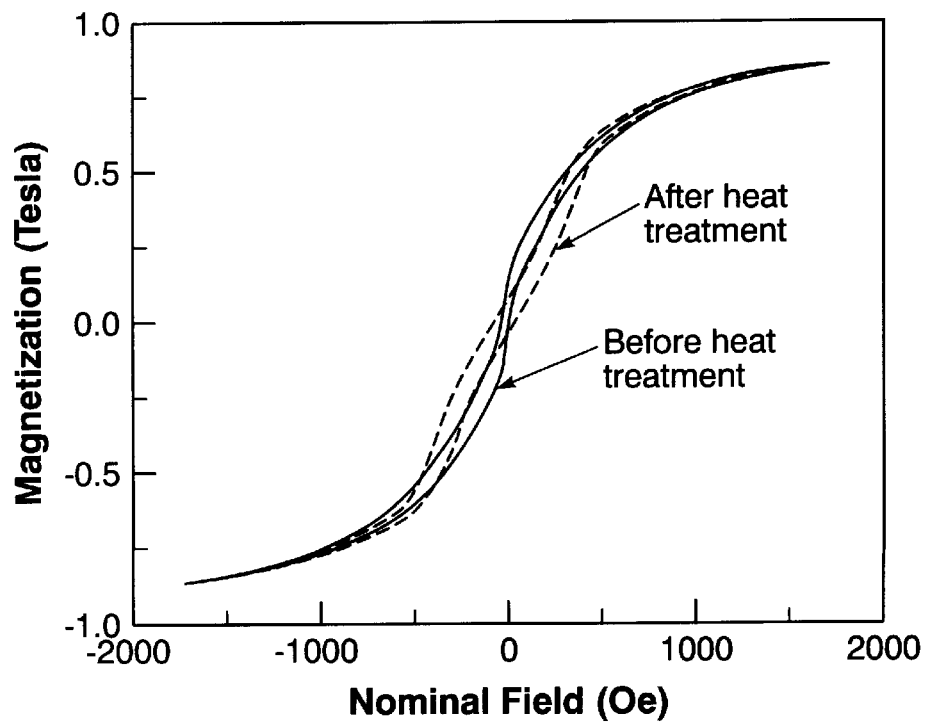
FIG. 3 is a comparative graphical illustration of the magnetization change caused by treatment with the sample under a compressive load of 26.7 MPa.

FIG. 2 graphically illustrates the improvement in magnetostriction achieved with a sample of Terfernol-D under a no external loading condition, when treated as hereinbefore described by heating to 840° C. for 10 minutes under a compressive stress of 88 MPa. As graphically shown in FIG. 2, the stress anistropy built-in by the treatment substantially improved the saturation magnetostriction from 700 ppm to 1000 ppm while the maximum derivative of magnetostrictive strain v. magnetic field curve (d33 constant) increased from $1.3 \times 10^{-6}$/Oe to $2.4 \times 10^{-6}$/Oe. The affect of annealing treatment on dependence of the magnetization of Terfenol-D as the magnetostrictive material is graphically shown in FIG. 3 in terms of the slope of the magnetization with low applied fields, from measurements taken under a compressive load of 26.7 MPa on the sample being tested. Prior to treatment of the sample, a substantial fraction of magnetization arises from non-magnetostrictive 180° domain wall motion. Following treatment, the same low field magnetization proceeds by magnetostrictive magnetization process.

According to another embodiment of the invention, the magnetostrictive material 10 as diagrammed in FIG. 1, is a composite formed from magnetostrictive components, such as a powder or bulk strips, and a lower melting temperature binder, such as an epoxy resin. Such composite material is subject to timed heating 12 as hereinbefore described, also causing flow of the heated binder which remains in such flow condition during the cooling stage 14 until the binder hardens. Such hardening of the binder constitutes the source of internal stress for the magnetostrictive composite, eliminating the need for externally generated prestress. The relative flow rates of the magnetostrictive component and the binder determine the direction of the prestress internally generated during treatment and the orientation of the magnetic moments of the magnetostrictive component in order to achieve the improvements in use of the material 16 such as those hereinbefore described.

Obviously, other modifications and variations of the present invention may be possible in light of the foregoing teachings. It is therefore to be understood that within the scope of the appended claims the invention may be practiced otherwise than as specifically described.

What is claimed is:

1. In a process for treatment of magnetostrictive material which includes heating of said material and applying compressive stress thereto to affect magnetostriction during use of the material in an application wherein the material undergoes loading by said magnetostriction and strain under a magnetic field, the improvement residing in annealing the material to a controlled degree in order to maximize said magnetostriction including the steps of: heating the material for a limited period of time; cooling the material from the heating temperature in sequence after said heating thereof; and maintaining compressive stress on the material during said cooling thereof for retention of a built-in prestress in the material prior to said use thereof.

2. The process as defined in claim 1, wherein said compressive stress providing the built-in prestress is generated externally of the material to a level >71 MPa and uniaxially applied thereto, during said heating thereof.

3. The process as defined in claim 2, wherein the magnetostrictive material is Terfenol-D.

4. The process as defined in claim 3, wherein said elevated temperature is 840° C., below melting point of the Terfenol-D, and said limited period of time for said step of heating is ten minutes.

5. The process as defined in claim 11, wherein the magnetostrictive material is Terfenol-D having a melting point above said elevated temperature of 840° C., while said limited period of time for said step of heating is ten minutes.

6. The process as defined in claim 1, wherein said magnetostrictive material is a composite formed by a magnetostrictive component and a binder undergoing flow in response to melt by said heating to the elevated temperature, said compressive stress for providing the built-in prestress being generated internally of the material during said cooling thereof in response to hardening of the binder under flow previously induced during said heating of the material.

* * * * *